(12) United States Patent
Sera et al.

(10) Patent No.: US 7,863,809 B2
(45) Date of Patent: Jan. 4, 2011

(54) LIGHT-EMITTING DEVICE AND METHOD OF MANUFACTURING LIGHT-EMITTING DEVICE

(75) Inventors: Hiroshi Sera, Chino (JP); Hideto Ishiguro, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1113 days.

(21) Appl. No.: 11/466,668

(22) Filed: Aug. 23, 2006

(65) Prior Publication Data
US 2007/0053202 A1 Mar. 8, 2007

(30) Foreign Application Priority Data
Sep. 2, 2005 (JP) .............................. 2005-254495
May 25, 2006 (JP) .............................. 2006-145226

(51) Int. Cl.
*H01L 51/40* (2006.01)
*H05B 33/10* (2006.01)

(52) U.S. Cl. ........................... 313/504; 313/512; 445/25

(58) Field of Classification Search .................. 313/504, 313/506, 512; 445/25, 24; 427/66
See application file for complete search history.

(56) References Cited
U.S. PATENT DOCUMENTS
7,190,335 B2    3/2007   Yamazaki et al.

2003/0211643 A1*  11/2003  Fujimori et al. ............... 438/22
2004/0061434 A1*  4/2004   Mori et al. ................... 313/500
2006/0246620 A1   11/2006  Nagayama et al.
2007/0160746 A1   7/2007   Yamazaki et al.

FOREIGN PATENT DOCUMENTS

| JP | A 8-222371 | 8/1996 |
|---|---|---|
| JP | A 9-320760 | 12/1997 |
| JP | A-2003-017251 | 1/2003 |
| JP | A-2003-338386 | 11/2003 |
| KR | A-2003-0077430 | 10/2003 |
| WO | WO 2004/110105 A1 | 12/2004 |

* cited by examiner

*Primary Examiner*—Karabi Guharay
(74) *Attorney, Agent, or Firm*—Oliff & Berridge, PLC

(57) ABSTRACT

A method of manufacturing a light-emitting device, in which a light-emitting body is sealed between a substrate and a sealing body, includes forming a light-emitting layer, made of a light emitting material, on the surface of the substrate; forming the sealing body which partially covers the light-emitting layer; and removing portions of the light-emitting layer, which are not covered by the sealing body, using the sealing body as a mask, thereby forming the light-emitting body.

6 Claims, 4 Drawing Sheets

LIGHT-EMITTING DEVICE AND METHOD OF MANUFACTURING LIGHT-EMITTING DEVICE

BACKGROUND

1. Technical Field

The present invention relates to a method of manufacturing a light-emitting device using a light emitting material such as an organic EL (Electro-Luminescent) material and a light-emitting device manufactured by using the manufacturing method.

2. Related Art

This type of light-emitting device is provided with a light-emitting body formed on the surface of a substrate. The light-emitting body is formed in a desired shape by selectively removing a film body (hereinafter, referred to as 'a light-emitting layer') of a light emitting material covering a substrate. JP-A-8-222371 and JP-A-9-320760 have disclosed that a light-emitting layer is selectively removed by irradiating laser on the light-emitting layer covering a substrate, which is referred to as 'the laser ablation technique'.

In the laser ablation technique, however, a light-emitting layer must be removed little by little at a time. Therefore, it takes a long time to completely remove a desired region. Particularly, a region on the surface of a substrate, in which terminals for inputting signals to a light-emitting device are arranged (for example, a region on which an IC chip is mounted), is relatively wide. Accordingly, it takes a considerable time to completely remove the light-emitting layer formed on the region. Further, since waste scattered from the light-emitting layer by the irradiation of laser adheres to each section of an electrode and wiring lines, a step of removing the waste is needed. As described above, it is difficult to effectively remove the light-emitting layer when using the laser ablation technique. As a result, the productivity of the light-emitting device is limited.

SUMMARY

An advantage of the invention is that it provides a method of effectively removing an unnecessary portion of a light-emitting layer.

According to a first aspect of the invention, a method of manufacturing a light-emitting device, in which a light-emitting body is sealed between a substrate and a sealing body, includes forming a light-emitting layer, made of a light emitting material, on the surface of the substrate (for example, Step A2 of FIG. 2); forming the sealing body which partially covers the light-emitting layer (for example, Step B3 of FIG. 3); and removing portions of the light-emitting layer, which are not covered by the sealing body, using the sealing body as a mask, thereby forming the light-emitting body (for example, Step B4 of FIG. 3).

According to the method, it is possible to effectively remove the light-emitting layer in comparison with the case where unnecessary portions of the light-emitting layer are removed by the laser ablation technique, because the portions of the light-emitting layer, which are not covered by the sealing body, are removed using the sealing body as a mask. Further, since the sealing body serving as an element composing the light-emitting device is utilized as a mask, the simplification of manufacturing processes and the reduction in manufacturing cost are realized, in comparison with when a mask is formed independently from an element composing a light-emitting device. Moreover, a specific example of the manufacturing method will be described below as a first embodiment.

'Sealing' referred in the invention includes a case where only a specific portion of the light-emitting body is blocked from the external air, in addition to a case where the light-emitting body is confined between the sealing body and the substrate so as to be completely blocked from the external air. That is, even when the light-emitting body partially comes in contact with the external air (for example, when the side surface 163 of the light-emitting body 16 is exposed from the sealing body, as shown in FIG. 1), and if other portions are blocked from the external air by the cooperation between the sealing body and the substrate, the construction is included in the concept of 'sealing' of the invention.

A preferred embodiment of the manufacturing method according to the first aspect includes forming wiring lines on the surface of the substrate prior to forming the light-emitting layer (for example, Step A1 of FIG. 2); removing a portion of the light-emitting layer which is overlapped with the wiring lines (for example, Step B1 of FIG. 3); and electrically connecting the wiring lines to an electrode covering the light-emitting layer through the removed portion (for example, Step B2 of FIG. 3).

According to the embodiment, it is possible to electrically connect the wiring lines to the electrode through the portion in which the light-emitting layer is removed. Moreover, in the step of electrically connecting the wiring lines to the electrode, a separate conductive body (for example, a fourth electrode 24 of FIG. 1) from the electrode formed on the surface of the light-emitting layer may be formed across the wiring lines and the electrode so as to electrically connect both the wiring lines and the electrode, prior to the step of removing a portion of the light-emitting layer. Further, the electrode positioned on the surface of the light-emitting layer may be formed in such a shape that a portion thereof comes in contact with the wiring lines. The method of partially removing the light-emitting layer is arbitrary in the step of removing a portion of the light-emitting layer. For example, the portion of the light-emitting layer, which is overlapped with the wiring lines, may be removed by the laser ablation method or may be removed by mechanical cutting.

A light-emitting device according to an embodiment of the invention includes a substrate (for example, a substrate 10 of FIG. 1); a light-emitting body (for example, a light-emitting body 16 of FIG. 1) that is formed of a light emitting material on the surface of the substrate; and a sealing body (for example, a sealing body 32 of FIG. 1) that is installed in the substrate so as to cover the sealing body. The side surface (323) of the sealing body and the side surface (163) of the light-emitting body are arranged on the same plane (for example, a plane P1 of FIG. 1). In the light-emitting device, since the side surface of the sealing body and the side surface of the light-emitting body are positioned on the same surface, input terminals of anode and cathode or wiring lines of the light-emitting device can be effectively disposed within an extremely small area around the light-emitting device. For example, when the light-emitting device is applied to a display device, a so-called narrow-framed display device is implemented.

According to a second aspect of the invention, a method of a light-emitting device, in which a light-emitting body is interposed between first and second electrodes facing each other, includes forming a light-emitting layer, made of a light emitting material, on the surface of the substrate (for example, Step A2 of FIG. 2); forming the second electrode which partially covers the light-emitting layer (for example, Step A3 of FIG. 2); forming a third electrode on the surface of the light-emitting layer, the third electrode covering the surface and side surface of the second electrode (for example, Step A4 of FIG. 2); and removing portions of the light-emitting layer, which are not covered by the third electrode, using the third electrode as a mask, thereby forming the light-emitting body (for example, Step C1 of FIG. 5).

According to the manufacturing method, it is possible to effectively remove the light-emitting layer in comparison with the case where unnecessary portions of the light-emitting layer are removed by the laser ablation technique, because the portions of the light-emitting layer, which are not covered by the third electrode, are removed using the third electrode as a mask. Further, since the third electrode serving as an element composing the light-emitting device is utilized as a mask, the simplification of manufacturing processes and the reduction in manufacturing cost are realized, in comparison with when a mask is formed independently from an element composing a light-emitting device. Moreover, a specific example of the manufacturing method will be described below as a second embodiment.

However, in the construction where the second electrode is partially exposed from the third electrode (for example, the side surface of the second electrode is exposed from the third electrode), the portion of the second electrode which is exposed from the third electrode can be deteriorated or damaged, when the light-emitting layer is removed using the third electrode as a mask. For example, when the light-emitting layer is removed by etching in the step of removing, the second electrode can be damaged due to the adherence of etching liquid. Further, when the light-emitting layer is removed by plasma processing, the second electrode can be damaged due to the adherence of plasma. In the manufacturing method according to the second aspect of the invention, however, the substance (etching liquid or plasma) used in the processing is not adhered on the second electrode, even when the light-emitting layer is removed by any method in the step of removing. That is because the surface and side surface of the second electrode is covered by the third electrode. Therefore, according to the invention, the second electrode is effectively prevented from being deteriorated and damaged. Since the protection of the second electrode is realized as described above, the manufacturing method according to the second aspect of the invention is preferably adopted when the second electrode is formed of a material which is more easily deteriorated than the third electrode in the step of removing (that is, a material having higher reactivity with respect to a material, used in removing the light-emitting layer, than the third electrode).

Even in the manufacturing method according to the second aspect, the sealing body which seals the light-emitting body with the substrate interposed therebetween is installed, similar to the manufacturing method according to the first aspect. In the step of installing the sealing body (for example, Step C3 of FIG. 5), the sealing body is preferably bonded to the region of the substrate in which the light-emitting layer is removed in the step of removing. According to the embodiment, the sealing body can be reliably fixed to the substrate, because the light-emitting layer (light-emitting body) is not interposed between the sealing body and the substrate. Further, since the light-emitting body is not exposed between the sealing body and the substrate, it is possible to prevent the deterioration of the light-emitting layer caused by the adherence of moisture or external air.

In the preferred embodiment of the manufacturing method according to the second aspect, the wiring lines are formed on the surface of the substrate (for example, Step A1 of FIG. 2), prior to the step of forming the light-emitting layer. Further, the portion of the light-emitting layer, which is overlapped with the wiring lines, is removed in the step of removing, and the fourth electrode, which electrically connects the wiring lines to the third electrode through the removed portion, is formed (for example, Step C2 of FIG. 5). According to the embodiment, the wiring lines and the electrode can be electrically connected to each other through the portion in which the light-emitting layer is removed. Further, in the step of removing portions of the light-emitting layer which are not covered by the third electrode, the structure for electrically connecting the wiring lines and the third electrode is manufactured. Therefore, the efficiency of the manufacturing processes is realized in comparison with when the structure for electrically connecting the wiring lines and the third electrode (for example, a through-hole provided in the light-emitting layer) is formed independently from the step of removing.

A light-emitting device according to one embodiment of the invention includes a substrate (for example, the substrate 10 of FIG. 4); a first electrode (for example, a first electrode 12 of FIG. 4) that is formed on the surface of the substrate; a light-emitting body (for example, the light-emitting body 16 of FIG. 4) that is formed on the surface of the first electrode; a second electrode (for example, a second electrode 22 of FIG. 4) that partially covers the surface of the light-emitting body and faces the first electrode with the light-emitting body interposed therebetween; and a third electrode (for example, a third electrode 23 of FIG. 4) that is formed on the surface of the light-emitting body so as to cover the surface (220) and side surface (221) of the second electrode. The side surface (163) of the light-emitting body and the side surface (231) of the third electrode are arranged on the same plane (for example, the plane P2 of FIG. 4). In the light-emitting device, since the side surface of the light-emitting body and the side surface of the third electrode are positioned on the substantially same plane, the area in the vicinity of the light-emitting body can be reduced, and the vicinity can be used in an internal wiring region. Further, since there is room for disposing input terminal portion of anode and cathode, the portion can be reduced. For example, when the light-emitting device is applied to a display device, a so-called frame-narrowed display device can be implemented.

The light-emitting device according to a more preferred embodiment is provided with a fourth electrode (for example, the fourth electrode 24 of FIG. 4) that has a first portion (for example, a first portion 241 of FIG. 4) coming in contact with the third electrode and a second portion (for example, a second portion 242 of FIG. 4) positioned in the region of the substrate in which the light-emitting body is not formed. According to the construction, the second and third electrodes are electrically connected to external elements through the fourth electrode.

In the removing step of the manufacturing method according to the first and second aspects of the invention, the method in which the light-emitting layer is removed through the plasma processing using the sealing body or the third electrode as a mask is preferably adopted. Through the plasma processing, the light-emitting layer can be removed effectively and precisely. The plasma processing in the above-described embodiments includes plasma etching and reactive ion etching, in which the light-emitting layer is removed by a reaction gas changed into plasma. Further, an ashing step using oxygen or ion as a reaction gas is also included the plasma processing of the invention. Moreover, a specific method of removing the light-emitting layer in the removing step of the invention is arbitrary. For example, the light-emitting layer may be removed by ion milling and sputter etching, using the sealing body or the third electrode as a mask.

However, if light with a wavelength which is significantly different from the light-emission wavelength of the light-emitting layer is irradiated at the time of plasma processing, the light-emitting layer can be deactivated, thereby decreasing characteristics thereof. Therefore, as a reaction gas used in the plasma processing, a reaction gas is preferably adopted, which includes such a wavelength that the light-emission intensity of the light-emitting layer becomes maximum in the wavelength range of light (plasma light) radiated by changing the reaction gas into plasma. According to the embodiment, it is possible to suppress the deactivation of the light-emitting layer and the degradation of characteristics caused thereby, because the light radiated by changing a reaction gas into plasma includes a wavelength of light emitted from the light-emitting layer.

In the step of forming the light-emitting layer according to the first and second aspects of the invention, a specific method of forming the light-emitting layer is arbitrary. For example, various coating techniques such as a spin coat method, a printing method, and an inkjet method or various film-formation techniques represented by vacuum evaporation method can be used in forming the light-emitting layer. From the point of view in which a light-emitting layer with a uniform thickness is maintained by an inexpensive and simple equipment, the spin coat method is particularly preferable. Since the uniformity of the light-emitting layer is maintained across the entire surface of the substrate, the spin coat method is particularly preferable in manufacturing a light-emitting device in which the light-emitting layer formed on the substrate is formed of only single light emitting material.

The light-emitting device manufactured by the manufacturing method of the invention is used in various electronic apparatuses. A typical example of the electronic apparatus is an apparatus using the light-emitting device as a display device. As this type of electronic apparatus, there is a personal computer, a mobile phone or the like. Moreover, the use of the light-emitting device according to the invention is not limited to display an image. For examples the light-emitting device of the invention can be applied as an exposure device (exposure head) for forming a latent image on an image carrier such as a photoconductor drum through the irradiation of light.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the present invention will be described with reference to the drawings. In the respective drawings, the dimension ratio of each section is set to differ from that of a real device, for convenience.

A: First Embodiment

A-1: Manufacturing Light-Emitting Device

Figure 1:
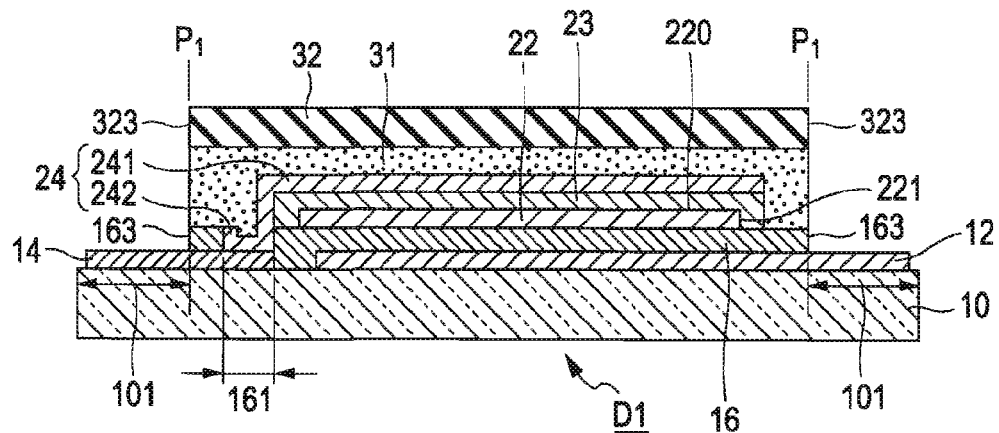
FIG. 1 is a cross-sectional view showing the construction of a light-emitting device according to a first embodiment of the present invention.

FIG. 1 is a cross-sectional view showing the construction of a light-emitting device according to a first embodiment of the invention. As shown in FIG. 1, the light-emitting device D1 of the present embodiment has a structure where a light-emitting body 16 is interposed between a substrate 10 and a sealing body 32. The substrate 10 is a substantially rectangular plate made of an optically transparent material, such as glass or plastic.

On the surface of the substrate 10, a first electrode 12 and wiring lines 14 are formed. The first electrode 12 made of an optically transparent conductive material such as ITO (Indium Tin Oxide) or IZO (Indium Zinc Oxide) functions as an anode of the light-emitting body 16. The first electrode 12 is formed across the region covered by the sealing body 32 and a region (hereinafter, referred to as 'mounting region') 101, which overhangs from the side surfaces 323 of the sealing body 32, on the substrate 10. The end portion of the first electrode 12, which is positioned in the mounting region 101, is connected to a terminal for inputting a signal to the first electrode from the outside.

Meanwhile, the wiring lines 14, which supply a signal to a second electrode 22 and a third electrode 23 functioning as a cathode of the light-emitting body 16, are formed across the region covered by the sealing body 32 and the mounting region 101 on the substrate 10. The end portion of the wiring lines 14, which leads to the mounting region 101, functions as a terminal for inputting a signal to the second electrode 22 and the third electrode 23 from the outside.

In the mounting region 101, parts (for example, an IC chip) for supplying a signal to the first electrode 12 and wiring lines 14 are mounted. The first electrode 12 and wiring lines 14 in the present embodiment are formed at once by selectively removing a single conductive film formed on the substrate 10. Therefore, the wiring lines 14 and the first electrode 12 are made of the same material (for example, ITO), and the respective thicknesses are substantially equal to each other.

The light-emitting body 16 is a film body formed of an organic EL material, and emits light at luminance according to the potential difference between the first electrode 12 and the second electrode 22 (or the third electrode) (that is, at luminance according to an electric current flowing between the first electrode 12 and the second or third electrode 22 or 33). The light-emitting body 16 in the present embodiment has a light-emission spectrum in which the intensity peak appears at a wavelength of about 645 nm. That is, the light-emitting body 16 emits red light.

The second electrode 22 is an electrode which is formed on the surface of the light-emitting body 16 so as to oppose the first electrode 12, with the light-emitting body 16 interposed therebetween. The second electrode 22 in the present embodiment partially covers the surface of the light-emitting body 16. More specifically, the dimension and shape of the second electrode 22 are selected so that the second electrode 22 is completely surrounded by the outer circumferential edge of the light-emitting body 16 when seen from a direction orthogonal to the substrate 10 (that is, the second electrode 22 is not formed in the region along the outer circumferential edge on the surface of the light-emitting body 16). The second electrode 22 is formed of a conductive material composed of an elemental metal such as calcium, magnesium, strontium, aluminum, or silver or an alloy which mainly consists of such metals.

The third electrode 23 as well as the second electrode 22 is an electrode functioning as a cathode of the light-emitting body 16. The outer dimension thereof is formed to be slightly lighter than that of the second electrode 22 so that the third electrode 23 covers both the surface 220 and the side surface (edge portion) 221 of the second electrode 22. The third electrode 23 is formed of a light-reflecting conductive material such as aluminum. Therefore, the light emitted from the light-emitting body 16 which reaches the surface of the third electrode 22 is reflected toward the substrate 10. That is, the light-emitting device D1 of the present embodiment is a bottom-emission-type device in which the light emitted from the light-emitting body 16 is emitted through the substrate 10.

FIG. 1 shows an example where only the light-emitting body 16 is interposed between the first electrode 12 and the second and third electrodes 22 and 23. However, a hole injection layer or hole transport layer may be inserted between the light-emitting body 16 and the first electrode 12 (anode), and an electron injection layer or electron transport layer may be inserted between the light-emitting body 16 and the second and third electrodes 22 and 23 (cathode). That is, it is sufficient to interpose the light-emitting body 16 between the first electrode 12 and the second and third electrodes 22 and 23 opposing each other.

As shown in FIG. 1, a notched section 161 is formed in a portion of the light-emitting body 16, which is overlapped with the wiring lines 14 when seen from the direction orthogonal to the substrate 10. The notched section 161 is formed by removing the light-emitting body 16. In the notched section 161, the wiring lines 14 are exposed from through the light-emitting body 16.

A fourth electrode 24 of FIG. 1 is an electrode for electrically connecting the second and third electrodes 22 and 23 to the wiring lines 14, and is formed of a conductive material such as aluminum. The fourth electrode 24 has such a shape that a first portion 241 covering the surface of the third electrode 23 and a second portion 242 set in the notched section 161 of the light-emitting body 16 are integrally formed. As the second portion 242 comes in contact with the wiring lines 14, the third electrode 23 (and the second electrode 22) is electrically connected to the wiring lines 14.

The sealing body 32 of FIG. 1 is an insulating plate material sealing the light emitting element on the substrate 10, the light emitting element being composed of the first electrode 125 the second and third electrodes 22 and 23, and the light-emitting body 16. The sealing body 32 is bonded to the substrate 10 by an adhesive 31 coated on the surface of the substrate 10. The sealing body 32 is formed of various materials such as glass and plastics, for example. Further, since the light-emitting device D1 in the present embodiment is a bottom-emission-type device, the sealing body 32 does not need to be optically transparent.

In the present embodiment, the light-emitting body 16 is formed by selectively removing a light-emitting layer, using the sealing body 32 as a mask (details thereof will be described below). Therefore, the side surface (side end surface) 323 of the sealing body 32 and the side surface 163 (and the side surface of the adhesive 31) of the light-emitting body 16 are positioned on the same plane P1. That is, the outer circumferential edge of the light-emitting body 16 overlaps the outer circumferential edge of the sealing body 32, when seen from the direction orthogonal to the substrate 10.

A-2: Method of Manufacturing Light-Emitting Device

Next, a method of manufacturing the light-emitting device D1 of the present embodiment will be described with reference to FIGS. 2 and 3.

Figure 2:
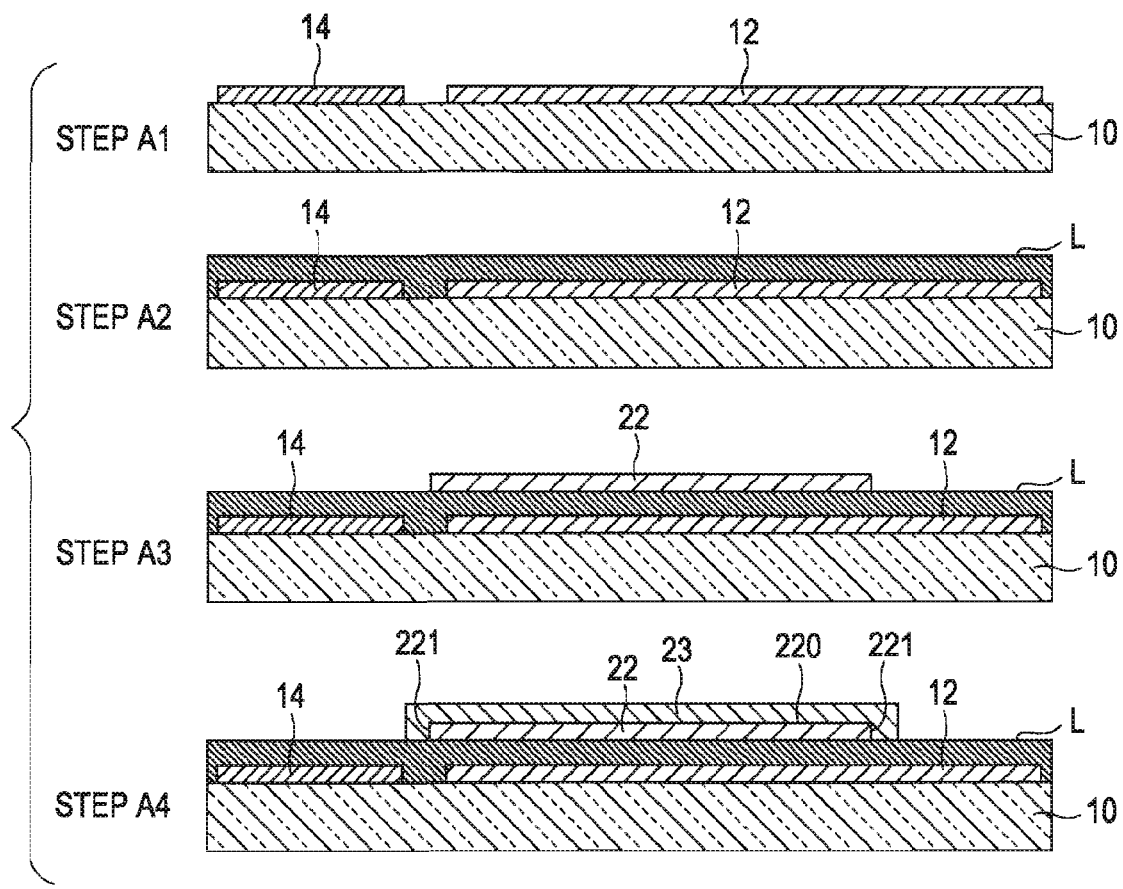
FIG. 2 is a process view for explaining a procedure of manufacturing the light-emitting device.
Figure 3:
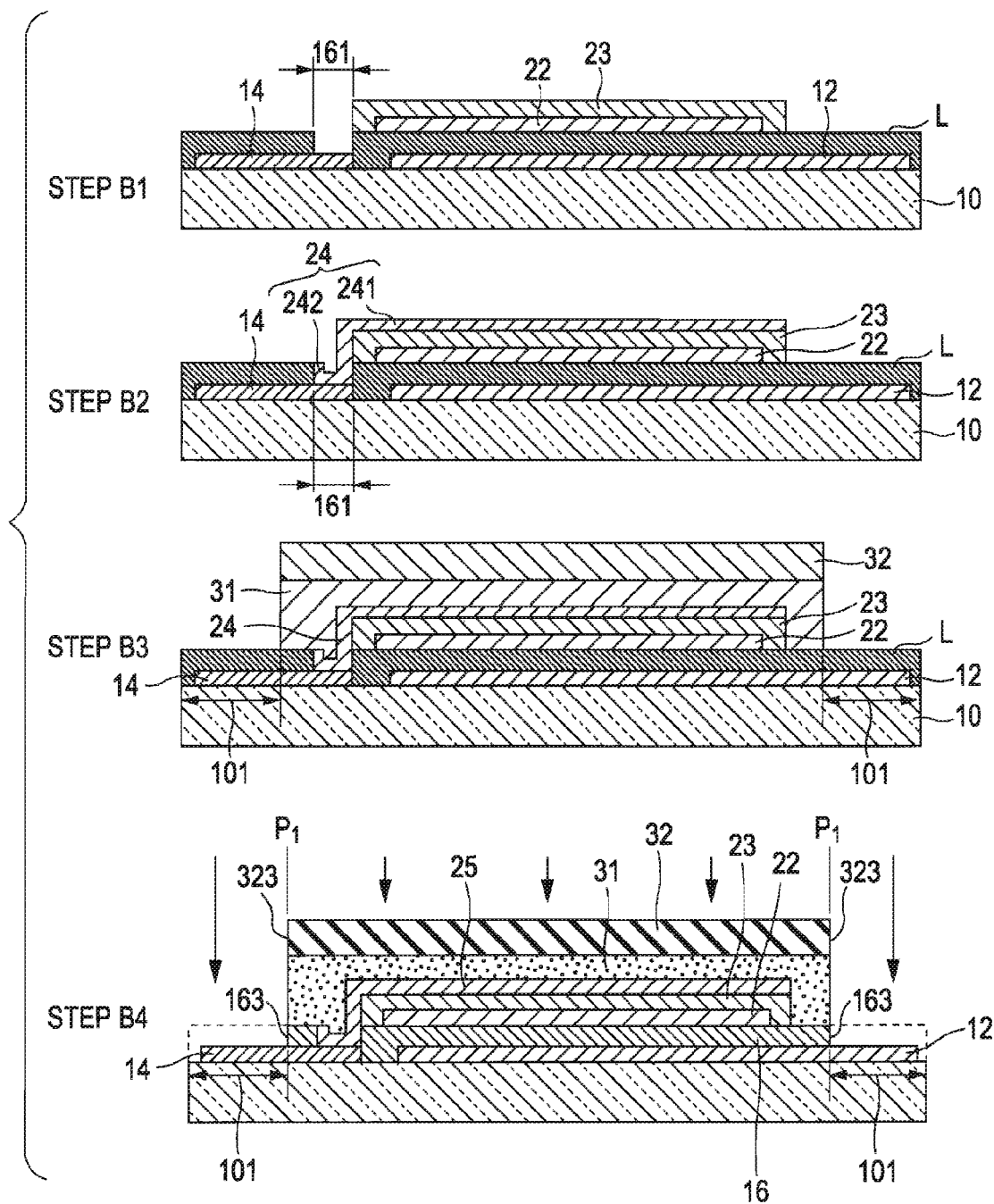
FIG. 3 is a process view for explaining a procedure of manufacturing the light-emitting device.

First, the first electrode 12 and the wiring lines 14 are formed at once by patterning a conductive film formed on the surface of the substrate 10 (Step A1 of FIG. 2). In the formation of the conductive film, a film-formation technique such as sputtering or CVD (Chemical Vapor Deposition) is adopted. In patterning the conductive film, a photolithography technique or etching technique is used.

Next, a light-emitting layer L made of an organic EL material is formed so as to cover the substrate 10 on which the first electrode 12 and the wiring lines 14 are formed (Step A2). The light-emitting layer L is formed by baking an organic EL material which is uniformly coated on the surface of the substrate 10 by a coating technique such as a spin coat method. The light-emitting layer L formed in such a method is formed substantially across the entire surface of the substrate 10 including the mounting region 101, in addition to the region which should be covered by the sealing body 32 of FIG. 1.

Next, the second electrode 22 is formed so as to partially cover the light-emitting layer L and to oppose the first electrode 12 with the light-emitting layer L interposed therebetween (Step A3). Further, the third electrode 23 covering the second electrode 22 is formed on the surface of the light-emitting layer L (Step A4). In Step A4, both the surface 220 and the side surface 221 of the second electrode 22 are covered by the third electrode 23. Therefore, when the third electrode 23 is formed (particularly, when it is patterned), the second electrode 22 is not damaged.

Subsequently, the notched section 161 is formed in a portion of the light-emitting layer L which is overlapped with the wiring lines 14 (Step B1 of FIG. 3). The notched section 161 is formed by partially removing the light-emitting layer L through a laser ablation technique, for example. Next, the fourth electrode 24 including the first and second portions 241 and 242 is formed (Step B2). The second portion 242 of the fourth electrode 24 is set in the notched section 161 so as to be electrically connected to the wiring lines 14. Moreover, the second to fourth electrodes 22 to 24 are formed by the film formation technique and patterning technique exemplified in Step A1.

Next, the sealing body 32 for partially covering the light-emitting layer L is bonded to the substrate 10 (more specifically, the surface of the light-emitting layer L) with the adhesive 31 (Step B3). After the above-described seeps are carried out, portions of the light-emitting layer L, which are positioned in the mounting regions 101, are selectively removed by plasma processing using the sealing body 32 as a mask (Step B4). As the light-emitting layer L is removed, the light-emitting body 16 is formed so that the side surface 163 thereof and the side surface 323 of the sealing body 32 are arranged on the same plane P1, as shown in FIG. 1. In a state where the substrate 10 to which the sealing body 32 is bonded in Step B3 is installed inside a chamber, the plasma processing (plasma etching) of Step B4 is carried out by changing the reaction gas, supplied into the chamber, into plasma (refer to FIG. 6). Through the above-described Step B4, the light-emitting body 16 having a shape corresponding to the outer shape of the sealing body 32 is formed, and portions (terminals) of the first electrode 12 and the wiring lines 14, which are positioned in the mounting regions 101, are exposed. In this way, the light-emitting device D1 of FIG. 1 is completed.

As described above, portions of the light-emitting layer L, which are positioned in the mounting regions 101, are removed using the sealing body 32 as a mask. Therefore, it is possible to shorten the time required for completely removing the light-emitting layer L, compared with when the portions are removed using the laser ablation technique. Further, since the sealing body 32 serving as an element composing the light-emitting device D1 is utilized as a mask in Step B4, the manufacturing processes are simplified, compared with when a mask is formed independently from elements of the light-emitting device D1. Moreover, a situation where waste scattered from the light-emitting layer L by laser irradiation adheres to each section of the first electrode 12 and wiring lines 14 does not occur in Step B4. Therefore, a step of removing this type of waste is not needed. According to the present embodiment, unnecessary portions of the light-emitting layer L are effectively removed, which makes it possible to improve the productivity of the light-emitting device D1.

The notched section 161 in the present embodiment is formed by removing the light-emitting layer L using the laser ablation technique. However, the area removed here is sufficiently smaller than the mounting region 101. Therefore, compared with the conventional technique in which both the notched section 161 and the mounting region 101 are removed using the laser ablation technique, the present embodiment has an advantage that the light-emitting layer L is effectively removed, even though the notched section 161 in the present embodiment is removed using the laser ablation technique. Further, the method of forming the notched section 161 is not limited to the laser ablation technique. For example, the notched section 61 may be formed by mechanically cutting the light-emitting layer L. In this case, expensive equipment for generating laser is not required. Therefore, it is possible to further reduce manufacturing cost.

When the light-emitting layer L is removed using the laser ablation technique, the laser beam can reach the first electrode 12 and the wiring lines 14 so as to degrade or damage these sections. On the contrary, a laser is not used in Step B4 in the present embodiment. Therefore, the degradation or damage of the first electrode 12 and the wiring lines in Step B4 does not occur in principle.

As a method of forming the light-emitting layer L which partially covers the surface of the substrate 10, an inkjet method (liquid droplet discharge method) is also considered, in which liquid droplets containing light emitting materials are selectively discharged on the surface of the substrate 10. Here, if only the laser ablation method is assumed as a technique of removing the light-emitting layer L, it can be advantageous in terms of productivity that the light-emitting layer L is formed using the inkjet method so as to cover only a desired portion on the surface of the substrate 10. That is because it is difficult to remove the light-emitting layer L, formed so as to cover the entire surface of the substrate 10, using the laser ablation technique. However, according to the present invention, it is possible to effectively and reliably remove an unnecessary portion of the light-emitting layer L, even when the light-emitting layer L is formed on the entire surface of the substrate 10 using a coating technique such as a spin coat method. Therefore, as compared with a case in which the inkjet method is adopted, productivity does not decrease. Further, a spin coat method which has higher reliability than the inkjet method can be adopted as a film-formation technique of the light-emitting layer L.

However, the light-emitting layer L is formed of a light emitting material in which the intensity of light emission becomes maximum at a specific wavelength (hereinafter, referred to as 'a peak wavelength'). When plasma processing is performed on the light-emitting layer L formed of such a material and a reaction gas radiating components which do not include the peak wavelength of the light-emitting layer L is used, the light-emitting layer L can be deactivated. For example, when the light-emitting layer L of which the peak wavelength is about 645 nm is processed as in the present embodiment, and if oxygen ($O_2$) which mainly radiates components (from ultraviolet light to blue light) with a wavelength less than 500 nm at the time of changing a reaction gas into plasma is used as a reaction gas, the light-emitting layer L is deactivated so that the light-emission characteristic thereof may be degraded.

Subsequently, in the plasma processing of Step B4, a reaction gas which radiates light in the range including the peak wavelength of the light-emitting layer L at the time of changing the reaction gas into plasma is preferably used. For example, in the plasma processing of the present embodiment, a reaction gas emitting light of which the wavelength is in the range of 500 nm to 700 nm is used. That is, a reaction gas of which plasma light is red light is used. A typical example of such a reaction gas is argon (Ar). If a reaction gas satisfying the above condition is used so as to perform plasma processing, it is possible to effectively suppress the deactivation of the light-emitting layer L and the degradation of characteristics caused thereby. Moreover, an argon gas can change into plasma by adjusting the pressure within a chamber between 200 mTorr and 300 mTorr and applying an electrical power of 500 W at a high frequency of about 13.56 MHz.

B: Second Embodiment

Next, a second embodiment of the invention will be described. Further, the same reference numerals as those used in FIGS. 1 to 3 are attached to elements of the present embodiment, which are common to those of the first embodiment, and the descriptions thereof will be omitted.

B-1: Construction of Light-Emitting Device

Figure 4:
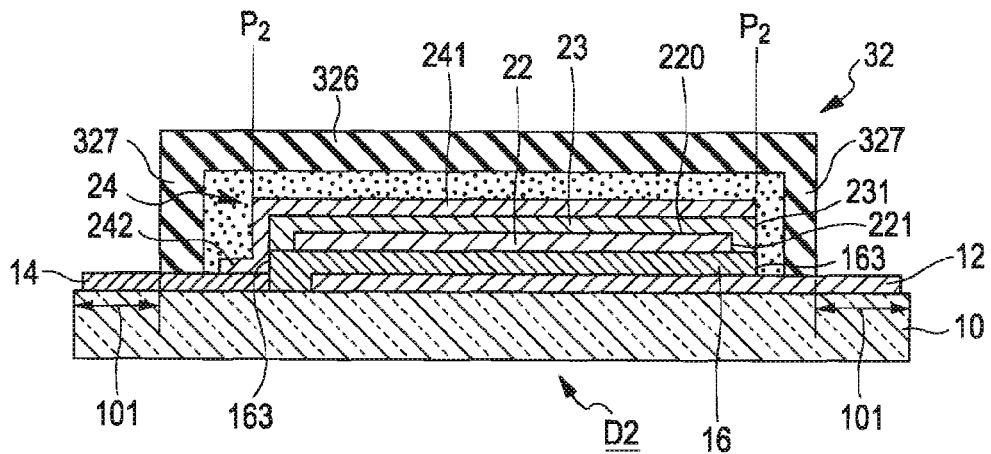
FIG. 4 is a cross-sectional view showing the construction of a light-emitting device according to a second embodiment of the present invention.

FIG. 4 is a cross-sectional view showing the construction of a light-emitting device D2 according to the present embodiment. In the first embodiment, it has been exemplified that the light-emitting layer L is removed using the sealing body 32 as a mask. Correspondingly, in the present embodiment, the light-emitting body 16 is formed by removing the light-emitting layer L using the third electrode 23 as a mask. Therefore, as shown in FIG. 4, the side surface 163 of the light-emitting body 16 and the side surface 231 of the third electrode 23 are positioned on the same plane P2. That is, the outer circumferential edge of the light-emitting body 16 is overlapped with the outer circumferential edge of the third electrode 23, when seen from the direction orthogonal to the substrate 10.

The sealing body 32 in the present embodiment is formed in such a shape that a plate-shaped plate section 326 opposing the substrate 10 with the light-emitting body 16 interposed therebetween and a frame-shaped projecting section 327 projecting toward the substrate 10 along the circumference of the plate section 326 are integrally formed. Further, as the surface of the projecting section 327 is boned to the substrate 10 with an adhesive, the sealing body 32 is fixed to the substrate 10. Therefore, in the present embodiment, the light-emitting body 16 is not interposed between the substrate 10 and the portion of the sealing body 32 which is bonded to the substrate (that is, the projecting section 327).

B-2: Method of Manufacturing Light-Emitting Device

Next, a method of manufacturing the light-emitting device D2 according to the present embodiment will be described with reference to FIG. 5. In this method, the steps to a step of forming the third electrode 23 are common to those of the first embodiment. That is, in the steps A1 and A2 of FIG. 2, the first electrode 12 and the wiring lines 14 are formed (Step A1), and the light-emitting layer L covering the substantially entire surface of the substrate 10 is formed (Step A2). Then, the second electrode 22 which partially covers the light-emitting layer L is formed (Step A3) and the third electrode 23 covering the surface 220 and the side surface 221 of the second electrode 22 is formed on the surface of the light-emitting layer L (Step A4).

Figure 5:
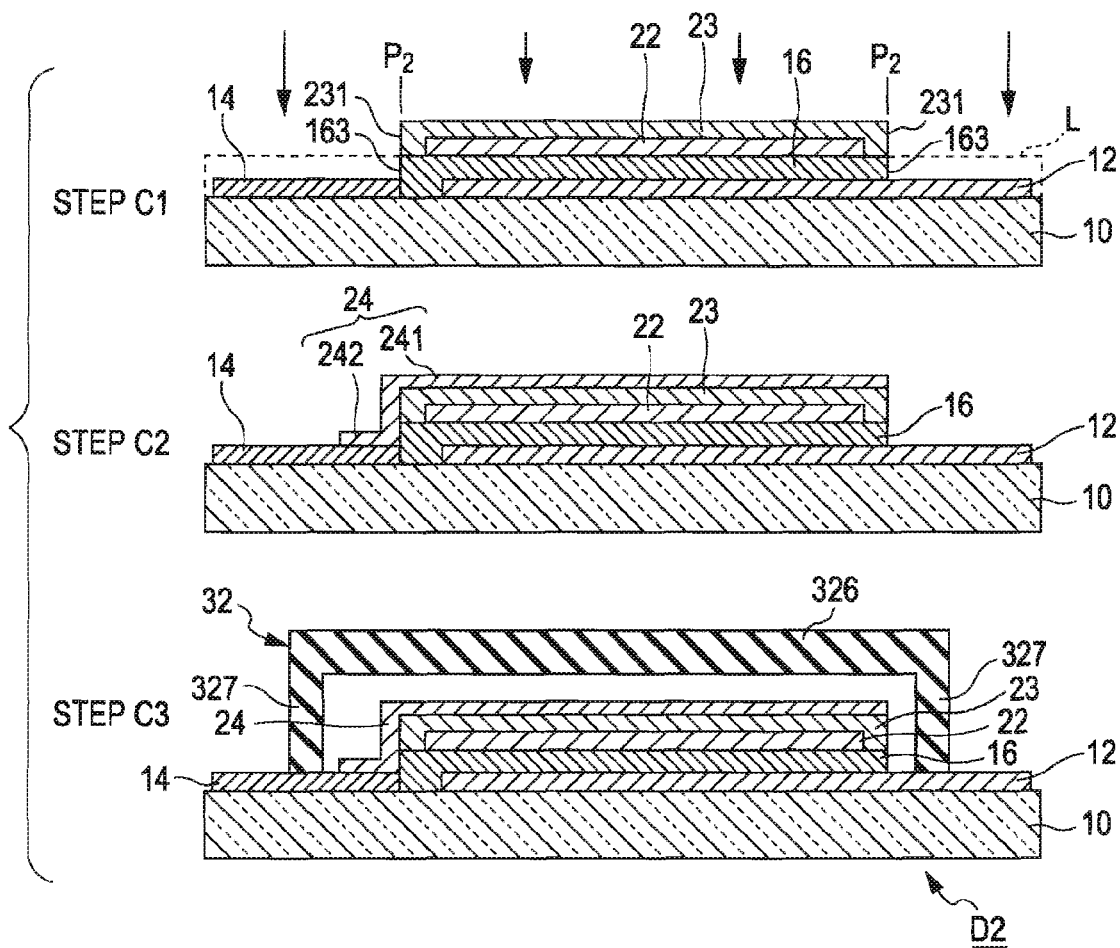
FIG. 5 is a process view for explaining a procedure of manufacturing the light-emitting device.
Figure 6:
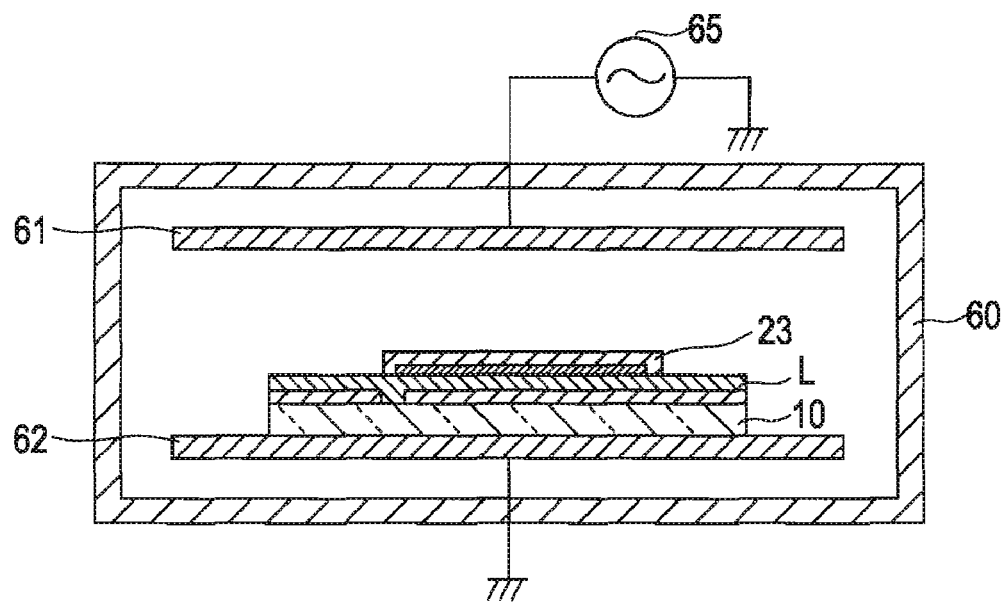
FIG. 6 is a cross-sectional view showing the construction of a device for removing a light-emitting layer.

Next, through the plasma processing using the third electrode 23 as a mask, the light-emitting body 16 is formed by selectively removing portions of the light-emitting layer L which are not covered by the third electrode 23 (Step C1 of FIG. 5). FIG. 6 is a cross-sectional view showing the construction of a device for performing Step C1. As shown in FIG. 6, first and second plates 61 and 62 are disposed inside a chamber 60. The first and second plates 61 and 62 are conductive plate materials which are spaced in parallel so as to oppose each other. Between them, the second plate 62 is grounded. Meanwhile, high-frequency power is supplied to the first plate 61 from a power supply 65. In FIG. 6, supply and discharge ports of reaction gas are not shown.

In the above-described construction, the substrate 10 having the third electrode 23 formed in Step A4 is loaded on the upper surface of the second plate 62, and the chamber 60 is filled with a reaction gas. Even in the present embodiment, the type of reaction gas is selected so that the wavelength range of light radiated by changing the reaction gas into plasma includes the peak wavelength of the light-emitting layer L, similar to the first embodiment. More specifically, in the plasma processing of the light-emitting layer L of which the peak wavelength is about 645 nm, argon (Ar) is preferably adopted as a reaction gas, in which the wavelength of light generated at the time of changing a reaction gas into plasma is in the range of 500 nm to 700 nm. According to the method, it is possible to suppress the deactivation of the light-emitting layer L and the degradation of characteristics, caused by light irradiation.

Next, the pressure within the chamber 60 is adjusted to 200 mTorr to 300 mTorr. Further, as electric power of about 500 W at a high frequency of 13.56 MHz is supplied to the first plate 61 from the power supply 65, the reaction gas is changed into plasma. Accordingly, the portions of the light-emitting layer L, which are not covered by the third electrode 23, are removed. As the light-emitting layer L is selectively removed, the light-emitting body 16 is formed so that the side surface 163 thereof and the side surface 231 of the third electrode 23 are arranged on the same plane P2, as shown in FIG. 4. Moreover, in Step C1, the temperature of the substrate 10 (or the second plate 62) is 80° C. to 130° C., and the temperature of the first plate 61 becomes higher than that of the substrate 10.

After the light-emitting layer L is selectively removed in the above-described procedure, the fourth electrode 24 is continuously formed (Step C2). The fourth electrode 24 includes a first portion 241, which is formed on the surface of the third electrode 23 so as to be electrically connected to the third electrode 23, and a second portion 242 which is formed on the surface of the substrate 10, in which the light-emitting layer L1 is removed in Step C1, so as to come in contact with the wiring lines 14. The third electrode 23 and the wiring lines 14 are electrically connected through the fourth electrode 24.

Next, the sealing body 32 is bonded to the surface of the substrate 10 (Step C3). More specifically, an adhesive is coated on the surface of the projecting section 327 of the sealing body 32, the surface opposing the substrate 10. Further, the projecting section 327 is bonded to the region of the substrate 10 in which the light-emitting layer L is removed in Step C1 (that is, the region around the light-emitting body 16), thereby fixing the sealing body 32 to the substrate 10. The light-emitting device D2 of FIG. 4 is completed through the above steps.

In the present embodiment, unnecessary portions of the light-emitting layer L are removed by the plasma processing using the third electrode 23 as a mask, as described above. Accordingly, the light-emitting layer L is effectively removed so as to improve productivity of the light-emitting device D2, similar to the first embodiment.

In the first embodiment, the light-emitting body 16 is necessarily interposed between the sealing body 32 and the substrate 10, because of the step in which the light-emitting layer L is removed using the sealing body 32 as a mask. In this construction, however, the side surface 163 of the light-emitting body 16 is exposed from the sealing body 32 (adhesive 31). Therefore, the light-emitting body 16 may be degraded by the contact with moisture and external air on the side surface. In the present embodiment, however, the light-emitting body 16 is sealed across the entire surface including the side surface 163 by the substrate 10 and the sealing body 32 (that is, the contact with the external air is blocked), because the sealing body 32 is bonded to the region of the substrate 10 in which the light-emitting layer L is removed. Therefore, according to the present embodiment, it is possible to prevent the degradation of the light-emitting body 16 caused by the contact with moisture and external air.

C: Modification

In the respective embodiment exemplified above, various modifications can be made. Specific modifications will be as follows. Moreover, the following embodiments may be properly combined.

(1) First Modification

In the respective embodiments, it has been exemplified that the light-emitting layer L is formed by a spin coat method. However, the light-emitting layer L may be formed through an arbitrary method. For example, various techniques such as a printing method, represented by a gravure printing method, and an inkjet method can be adopted in the formation of the light-emitting layer L. According to these methods, the light-emitting layer L can be selectively formed in only a desired region of the surface of the substrate 10. However, there is an advantage in that unnecessary portions of the light-emitting layer L are removed by the methods according to the respective embodiments, in order to completely remove light emitting materials scattered on the mounting region 101. Further, when the light-emitting layer L is formed of low-molecular organic EL material or inorganic EL material, a film-formation technique such as vacuum evaporation can be used in the formation thereof.

(2) Second Modification

In the respective embodiments, it has been exemplified that the light-emitting layer L is removed by the plasma processing. However, the method of removing the light-emitting layer L in the steps B4 and C1 is properly changed. For example, the light-emitting layer can be removed using various techniques such as ion milling and sputter etching. That is, if the method of manufacturing the light-emitting device according to the present invention includes the step in which the light-emitting layer L is removed using the sealing body 32 as a mask, the sealing body 32 partially covering the light-emitting layer L, or the step in which the light-emitting layer L is removed using the electrode (the third electrode 23 of the second embodiment) as a mask, the electrode partially covering the light-emitting layer L, any technique may be used for the removal thereof.

(3) Third Modification

In the respective embodiments, it has been exemplified that a reaction gas is selected in the plasma processing of the steps B4 and C1 to satisfy such a condition that the wavelength range of light radiated by changing a reaction gas into plasma includes the peak wavelength of the light-emitting layer L. However, the reaction gas used in these steps may not satisfy the above-described condition. For example, if the deactivation of the light-emitting layer L caused by the irradiation of light radiated from the reaction gas is not a particular problem, the light-emitting layer L may be removed in the steps B4 and C1 by the plasma processing (ashing) using oxygen or ion ($O_3$) as a reaction gas.

(4) Fourth Modification

The wiring lines 14 in the second embodiment are properly omitted. For example, while the wiring lines 14 of FIG. 4 are omitted, the second portion 242 of the fourth electrode 24 is formed so as to extend to the mounting region 101. Then, the end portion thereof may be used as a terminal.

(5) Fifth Modification

In the respective embodiments, it has been exemplified that the first electrode 12 functions as an anode and the second and third electrodes 22 and 23 function as a cathode. On the contrary, the first electrode 12 may function as a cathode, and the second and third electrodes 22 and 23 may function as an anode. In the respective embodiments, the bottom-emission-type light-emitting device has been exemplified. However, the invention may be applied to a top-emission-type light-emitting device. In the top-emission-type light-emitting device, the substrate 10 does not need to be optically transparent. Further, it has been exemplified in FIGS. 1 and 4 that only one light emitting element (the first electrode 12, the light-emitting body 16, and the second and third electrode 22 and 23) is disposed. However, the plurality of light emitting elements having the structure may be arranged in line or in a planar shape on the surface of the substrate 10.

(6) Sixth Modification

In the respective embodiments, it has been exemplified that a plate material formed in a substantially rectangular shape is used as the sealing body 32. However, the shape of the sealing body 32 is arbitrary. For example, an insulating material (for example, resin material), which is coated or formed so as to cover the surface of the substrate 10, may be used as a sealing body.

(7) Seventh Modification

In the respective embodiments, it has been exemplified that the light-emitting layer L is formed of an organic EL material. However, the material of the light-emitting layer L is properly changed. For example, a light-emitting layer can be formed of inorganic EL material. The light-emitting layer in <the present invention may be formed of a light emitting material which emits light by the impartment of electrical energy.

D: Application

Figure 7:
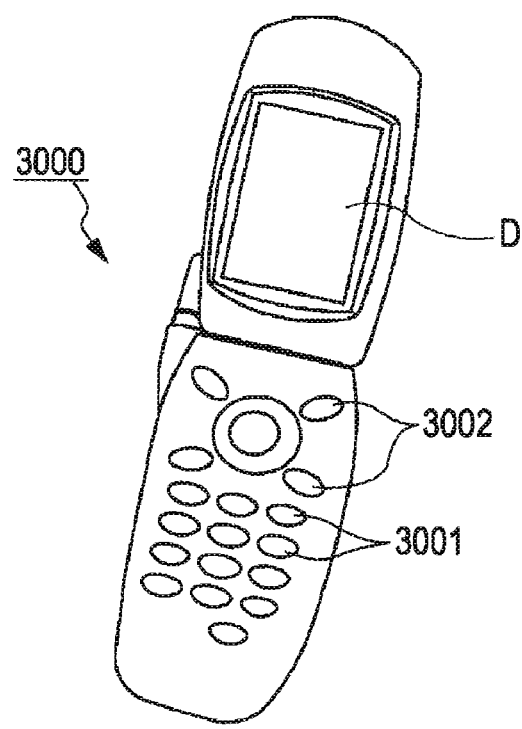
FIG. 7 is a perspective view showing an electronic apparatus using the light-emitting device of each embodiment.

Next, an electronic apparatus adopting the light-emitting device manufactured by the manufacturing method according to the invention will be described. FIG. 7 shows a mobile phone in which the light-emitting device D (D1 or D2) according to any one of the embodiments is applied. The mobile phone 3000 is provided with a plurality of control buttons 3001 and scroll buttons 3002 and the light-emitting device D serving as a display device. The screen displayed on the light-emitting device D is scrolled by controlling the scrolling buttons 3002.

As an electronic apparatus to which the light-emitting device according to the invention is applied, there is exemplified an apparatus provided with a personal computer, a personal digital assistant (PDA), a digital still camera, a television, a video camera, a car navigation device, a pager, an electronic organizer, an electronic paper, an electric calculator, a word processor, a work station, a television telephone, a POS terminal, a printer, a scanner, a photocopier, a video player, a touch panel or the like, in addition to the mobile phone shown in FIG. 7. The use of the light-emitting device according to the invention is not limited to displaying an image. For example, in an image forming apparatus such as an optical-wiring printer or electronic photocopier, an optical writing head is used, which exposes a photo conductor in accordance with an image which is to be formed on a recording material such as paper. However, as this type of optical writing head, the light-emitting device of the invention is preferably used.

What is claimed is:

1. A method of manufacturing a light-emitting device in which a light-emitting body is interposed between first and second electrodes facing each other, the method comprising:
    forming a light-emitting layer, made of a light emitting material, on the surface of the substrate;
    forming the second electrode which partially covers the light-emitting layer;
    forming a third electrode on the surface of the light-emitting layer, the third electrode covering the surface and side surface of the second electrode; and
    removing portions of the light-emitting layer, which are not covered by the third electrode, using the third electrode as a mask, thereby forming the light-emitting body.

2. The method of manufacturing a light-emitting device according to claim 1, further comprising
    bonding a sealing body, which seals the light-emitting body with the substrate interposed therebetween, to the region of the substrate in which the light-emitting layer is removed.

3. A light-emitting device manufactured by using the method of manufacturing a light-emitting device according to claim 1, the light-emitting device comprising:
    a substrate;
    a first electrode that is formed on the surface of the substrate;
    a light-emitting body that is formed on the surface of the first electrode;
    a second electrode that partially covers the surface of the light-emitting body and opposes the first electrode with the light-emitting body interposed therebetween; and
    a third electrode that is formed on the surface of the light-emitting body so as to cover the surface and side surface of the second electrode,
    wherein the side surface of the light-emitting body and the side surface of the third electrode are arranged on the same plane.

4. The light-emitting device according to claim 3, further comprising
    a fourth electrode that has a first portion coming in contact with the third electrode and a second portion positioned in the region of the substrate in which the light-emitting body is not formed.

5. The method of manufacturing a light-emitting device according to claim 1, wherein the third electrode extends beyond the surface of the second electrode.

6. The method of manufacturing a light-emitting device according to claim 1, wherein the third electrode partially covers the surface of the light-emitting layer.

* * * * *